(12) United States Patent
Shao

(10) Patent No.: US 12,336,170 B2
(45) Date of Patent: Jun. 17, 2025

(54) SEMICONDUCTOR STRUCTURE HAVING TWO WORD LINES COVERING PART OF OPPOSITE SIDE SURFACES OF THE PLURALITY OF SEMICONDUCTOR CHANNELS

(71) Applicant: CHANGXIN MEMORY TECHNOLOGIES, INC., Hefei (CN)

(72) Inventor: Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/952,265

(22) Filed: Sep. 25, 2022

(65) Prior Publication Data

US 2023/0017055 A1 Jan. 19, 2023

(30) Foreign Application Priority Data

May 20, 2022 (CN) .......................... 202210556171.7

(51) Int. Cl.
*H10B 12/00* (2023.01)
*G11C 5/06* (2006.01)

(52) U.S. Cl.
CPC ........... *H10B 12/482* (2023.02); *G11C 5/063* (2013.01); *H10B 12/053* (2023.02); *H10B 12/34* (2023.02); *H10B 12/488* (2023.02)

(58) Field of Classification Search
CPC .... H10B 12/05; H10B 12/053; H10B 12/315; H10B 12/34; H10B 12/482; H10B 12/488; H10B 12/50

USPC .................................................. 257/906, 907
See application file for complete search history.

(56) References Cited

U.S. PATENT DOCUMENTS 8,293,604 B2 10/2012 Yoon et al.
2016/0380060 A1* 12/2016 Kim ...................... H01L 21/764
438/586

FOREIGN PATENT DOCUMENTS

CN 102034759 A 4/2011

* cited by examiner

*Primary Examiner* — Hoai V Pham
(74) *Attorney, Agent, or Firm* — Kilpatrick Townsend & Stockton LLP

(57) ABSTRACT

Embodiments provide a method for fabricating a semiconductor structure and a structure thereof. The method includes: providing a substrate; forming, on the substrate, semiconductor channels arranged in an array along a first direction and a second direction; forming bit lines extending along the first direction, wherein the bit lines are positioned in the substrate, and each of the bit lines is electrically connected to the semiconductor channels arranged along the first direction; forming word lines extending along the second direction, wherein the word lines wrap part of side surfaces of the semiconductor channels arranged along the second direction, where one of the word lines includes two sub word lines arranged at intervals along the first direction, and the sub word lines cover part of opposite side surfaces of the semiconductor channels along the first direction; and forming isolation structures positioned between adjacent word lines and between adjacent sub word lines.

7 Claims, 9 Drawing Sheets

SEMICONDUCTOR STRUCTURE HAVING TWO WORD LINES COVERING PART OF OPPOSITE SIDE SURFACES OF THE PLURALITY OF SEMICONDUCTOR CHANNELS

CROSS-REFERENCE TO RELATED APPLICATION

This application claims priority to Chinese Patent Application No. 202210556171.7, titled "METHOD FOR FABRICATING SEMICONDUCTOR STRUCTURE AND STRUCTURE THEREOF" and filed to the State Patent Intellectual Property Office on May 20, 2022, the entire contents of which are incorporated herein by reference.

TECHNICAL FIELD

Embodiments of the present disclosure relate to the field of semiconductors, and more particularly, to a method for fabricating a semiconductor structure and a structure thereof.

BACKGROUND

A memory is a memory component configured to store programs and various data information. A random access memory (RAM) used in general computer systems may be divided into a dynamic random access memory (DRAM) and a static random access memory (SRAM). As a semiconductor memory device commonly used in computers, the DRAM comprises many repeating memory cells.

The memory cells generally include capacitors and transistors. Drains of the transistors are connected to bit lines, and sources of the transistors are connected to the capacitors. The capacitors include capacitor contact structures and capacitors. Word lines of the memory cells can control on or off of channel regions of the transistors, such that the data information stored in the capacitors is read by means of the bit lines, or the data information is written, by means of the bit lines, into the capacitors for storage.

However, at present, there are more parasitic capacitances between the adjacent word lines, which adversely affects electrical properties of a semiconductor structure.

SUMMARY

Embodiments of the present disclosure provide a method for fabricating a semiconductor structure and a structure thereof, which may at least improve electrical properties of the semiconductor structure.

According to some embodiments of the present disclosure, one aspect of the embodiments of the present disclosure provides a method for fabricating a semiconductor structure. The method includes: providing a substrate; forming, on the substrate, semiconductor channels arranged in an array along a first direction and a second direction; forming bit lines extending along the first direction, where the bit lines are positioned in the substrate, and each of the bit lines is electrically connected to the semiconductor channels arranged along the first direction; forming word lines extending along the second direction, wherein the word lines wrap part of side surfaces of the semiconductor channels arranged along the second direction, where one of the word lines includes two sub word lines arranged at intervals along the first direction, and the sub word lines cover part of opposite side surfaces of the semiconductor channels along the first direction; and forming isolation structures positioned between adjacent word lines and between adjacent sub word lines.

According to some embodiments of the present disclosure, another aspect of the embodiments of the present disclosure further provides a semiconductor structure, which includes: a substrate, a plurality of semiconductor channels, bit lines, word lines, and isolation structures. The plurality of semiconductor channels are positioned on the substrate, and the plurality of semiconductor channels are arranged in an array along a first direction and a second direction. The bit lines extend along the first direction, the bit lines are positioned in the substrate, and each of the bit lines is electrically connected to the plurality of semiconductor channels arranged along the first direction. The word lines extend along the second direction, the word lines wrap part of side surfaces of the plurality of semiconductor channels arranged along the second direction, one of the word lines includes two sub word lines arranged at intervals along the first direction, and the sub word lines cover part of opposite side surfaces of the semiconductor channels along the first direction. The isolation structures are positioned between adjacent word lines and between adjacent sub word lines respectively.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

It can be known from the background art that, as the integration level is continuously reduced, a gap between corresponding word lines becomes smaller and smaller, such that it is easier to generate parasitic capacitances between the adjacent word lines. However, increase of the parasitic capacitances may cause the adjacent word lines to interfere with each other, thereby degrading performance of a semiconductor structure.

Embodiments of the present disclosure provide a method for fabricating a semiconductor structure. Sub word lines arranged at intervals along the first direction are formed when forming the word lines, and the sub word lines cover part of the opposite side surfaces of the semiconductor channels along a first direction. Isolation structures are formed after the word lines are formed, and the isolation structures are positioned between the adjacent word lines and between the adjacent sub word lines, such that the parasitic capacitances between the adjacent word lines and the parasitic capacitances between the adjacent sub word lines may be reduced, thereby improving electrical properties of the semiconductor structure.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

Figure 11:
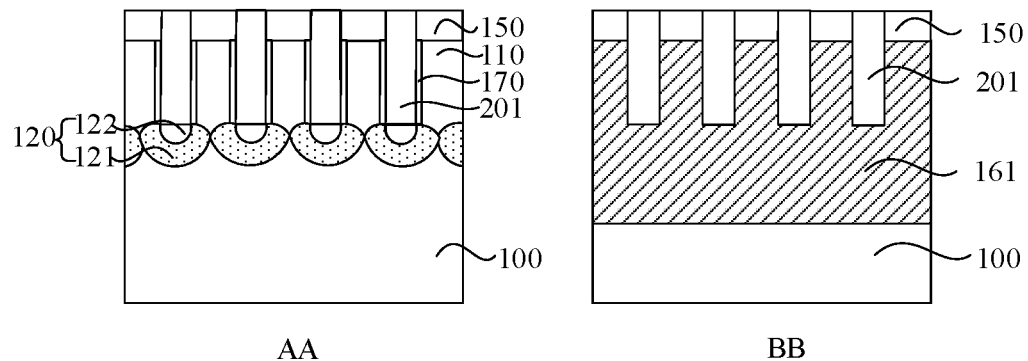

FIG. 11 is a top view of a semiconductor structure provided by an embodiment of the present disclosure. A substrate 100 is provided, and semiconductor channels 110 arranged in an array along a first direction X and a second direction Y are formed on the substrate 100. Next, bit lines 120 extending along the first direction X are formed, where the bit lines 120 are positioned in the substrate 100, and each of the bit lines 120 is electrically connected to the plurality of semiconductor channels 110 arranged along the first direction X. Next, word lines 130 extending along the second direction Y are formed, where the word lines 130 wrap part of side surfaces of the plurality of semiconductor channels 110 arranged along the second direction Y, one of the word lines 130 includes two sub word lines 131 arranged at intervals along the first direction X, and the sub word lines 131 cover part of opposite side surfaces of the semiconductor channels 110 along the first direction X.

In some embodiments, dielectric layers 140 are further formed around the semiconductor channels 110, and the dielectric layers 140 wrap the semiconductor channels 110 by one lap to avoid direct contact between the semiconductor channels 110 and the word lines 130.

The word lines 130 are constituted by forming the sub word lines 131 arranged at intervals along the first direction X, and the word lines 130 wrap part of the side walls of the semiconductor channels 110, which may ensure transmission properties of the word lines 130. Moreover, the isolation structures may also be subsequently formed between the adjacent word lines 130 and between the adjacent sub word lines 131, which may reduce the parasitic capacitance between the adjacent word lines 130, thereby improving the electrical properties of the semiconductor structure.

Figure 1:
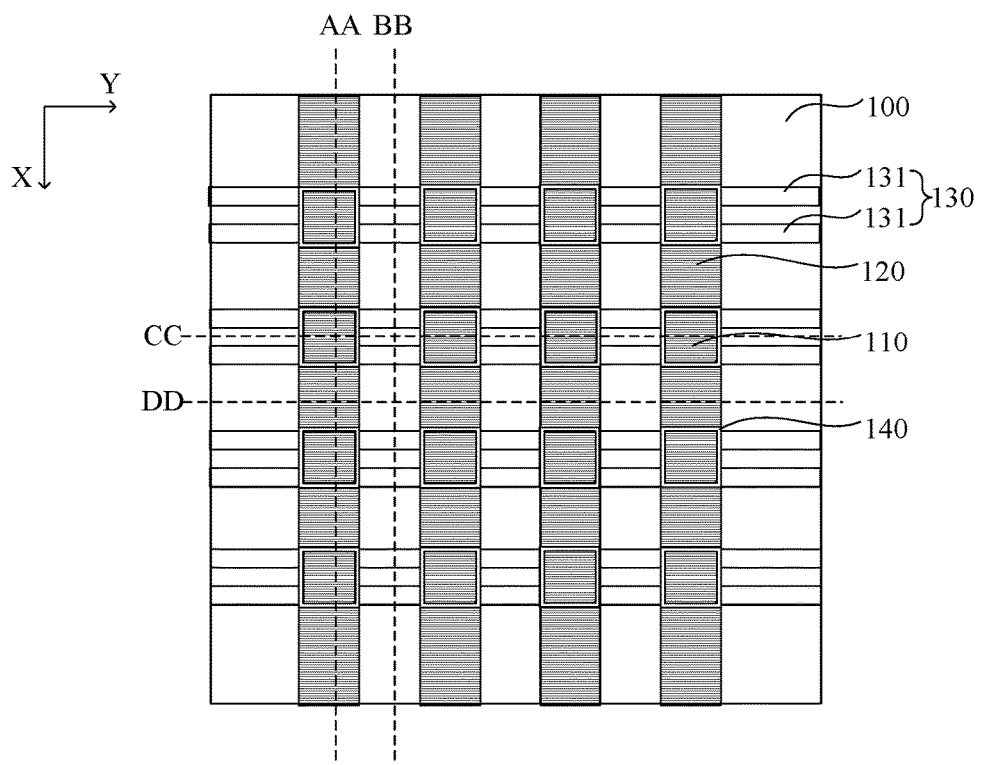
FIGS. 1 to 26 are schematic structural diagrams corresponding to steps of a method for fabricating a semiconductor structure according to an embodiment of the present disclosure.
Figure 2:
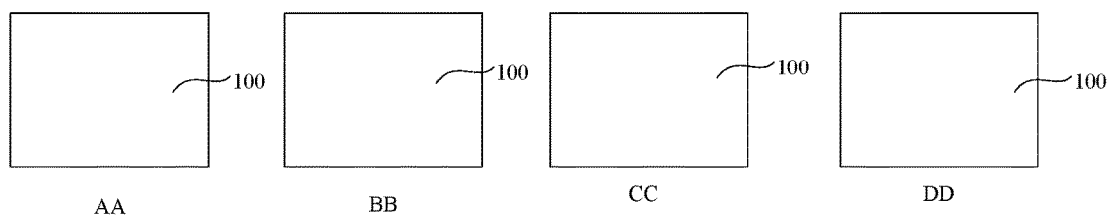

Referring to FIG. 2, FIG. 2 is a cross-sectional view of FIG. 1 taken along a dotted line direction.

The substrate 100 is provided. In some embodiments, a material of the substrate 100 may be a material such as silicon, germanium, or silicon germanium, and the material of the substrate 100 may also be doped with other materials. Taking an example where the material of the substrate 100 is silicon, the substrate 100 is doped with a small amount of trivalent element such as boron, indium, gallium or aluminum, such that a P-type substrate may be formed. Similarly, the substrate 100 is doped with a small amount of pentavalent element such as phosphorus, antimony or arsenic, such that an N-type substrate may be formed. Elements doped into the substrate 100 may be selected based on aspects such as actual requirements and product performance, and the present disclosure does not limit the material of the substrate 100 or the elements doped into the substrate 100.

Figure 3:
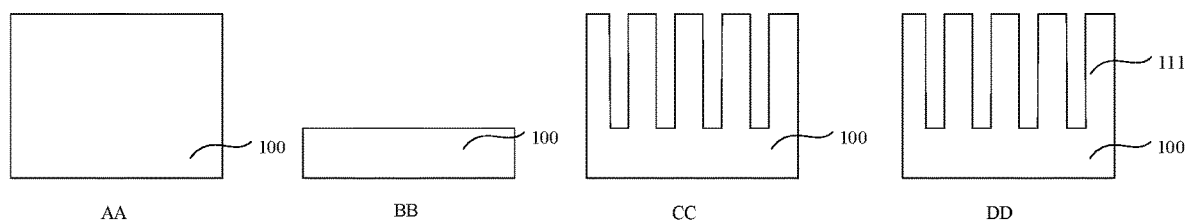
Figure 4:
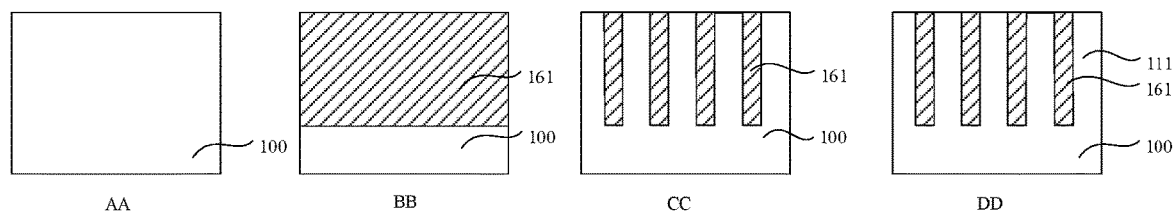
Figure 5:
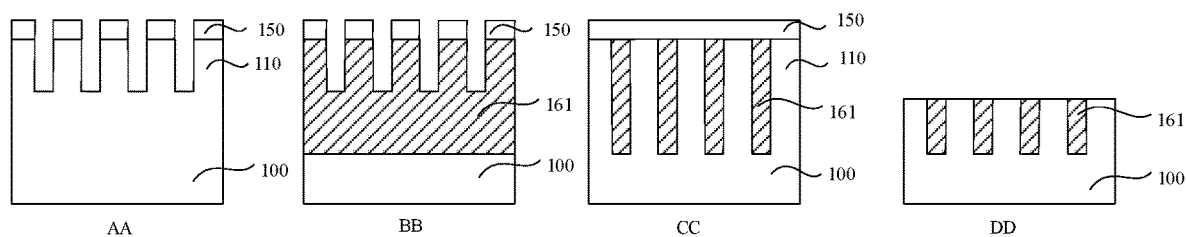

With reference to FIGS. 3 to 5, in some embodiments, the forming the semiconductor channels 110 includes: forming a mask layer 150, and patterning the substrate 100 using the mask layer 150 as a mask to form the semiconductor channels 110.

In some embodiments, referring to FIG. 3, the substrate 100 is patterned to form initial semiconductor channels 111. The initial semiconductor channels 111 extend along the first direction X and are spaced along the second direction Y.

In some embodiments, the initial semiconductor channels 111 may be formed by means of a self-aligned double patterning (SADP) process. In some other embodiments, the initial semiconductor channels 111 may also be formed by means of a self-aligned quadruple patterning (SAQP) process. The initial semiconductor channels 111 formed by means of the SADP or SAQP process may have more accurate patterns.

Referring to FIG. 4, a filling layer 161 is formed, and the filling layer 161 is positioned between adjacent initial semiconductor channels 111. A top surface of the filling layer 161 is flush with top surfaces of the initial semiconductor channels 111. It is to be noted that the flush mentioned here may mean that a height difference between the top surfaces is within an allowable error range. That is, the top surfaces may be regarded as flush when the height difference is within the allowable error range.

In some embodiments, a material of the filling layer 161 may be an insulating material such as silicon oxide or silicon nitride.

In some embodiments, the filling layer 161 also covers the top surfaces of the initial semiconductor channels 111, and the filling layer 161 positioned on the top surfaces of the initial semiconductor channels 111 may be removed by means of chemical polishing to expose top surfaces of the initial semiconductor channels 111.

Referring to FIG. 5, a mask layer 150 is formed, and the initial semiconductor channels 111 (referring to FIG. 4) are patterned by using the mask layer 150 as a mask to form the semiconductor channels 110. Patterning the initial semiconductor channels 111 (referring to FIG. 4) further includes: patterning the filling layer 161 to remove part of the filling layer 161.

In some embodiments, an oxide layer may be formed on the top surfaces of the initial semiconductor channel sill before the mask layer 150 is formed, and stress on the initial semiconductor channels 111 may be reduced in subsequent steps by forming the oxide layer.

In some embodiments, a material of the mask layer 150 may be a material such as silicon nitride, and the material of silicon nitride is relatively hard, such that in the subsequent steps, a shape of the mask layer 150 may not be greatly changed, and a pattern formed is more precise when patterning is performed subsequently using the mask layer 150 as the mask.

Each of the semiconductor channels 110 includes a first doped region, a channel region and a second doped region which are arranged in sequence, and a gate, a source and a drain of the transistor are subsequently formed by doping the first doped region, the channel region and the second doped region.

Figure 10:
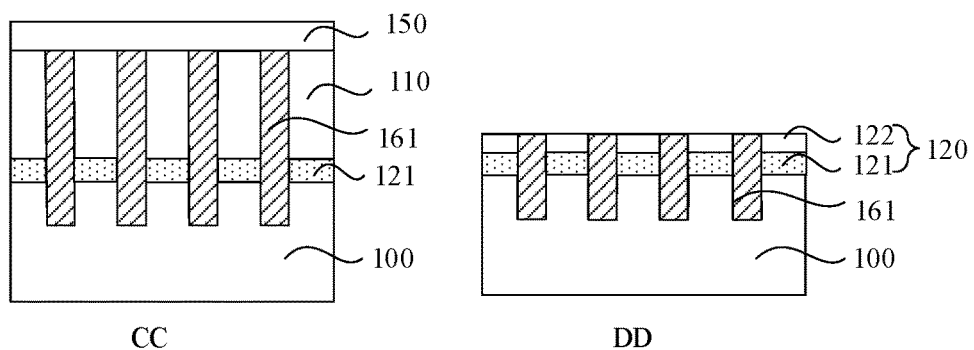
Figure 16:
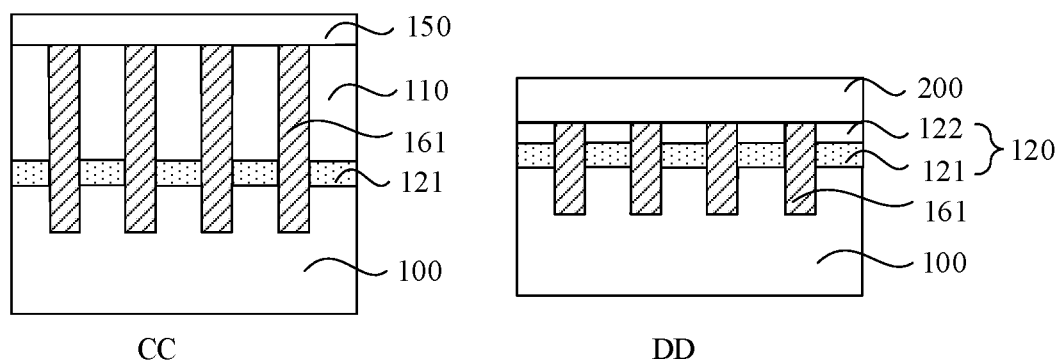

Referring to FIGS. 16 to 10, bit lines 120 are formed.

Figure 6:
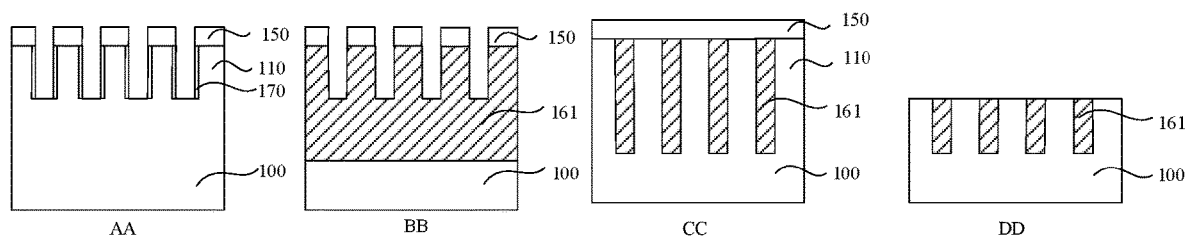

In some embodiments, referring to FIG. 6, spacer layers 170 are formed, where the spacer layers 170 cover side walls of the semiconductor channels 110 arranged along the first direction X. In some embodiments, the spacer layers 170 may be formed by consuming part of the semiconductor channels 110 by means of thermal oxidation. In some other embodiments, the spacer layers 170 may also be formed in other means, such as etching after deposition. By taking an example where the spacer layers 170 are formed by means of the thermal oxidation, the spacer layers 170 formed by means of the thermal oxidation are relatively dense, such that the semiconductor channels 110 may be protected from being adversely affected in the subsequent step of forming the bit lines.

Figure 7:
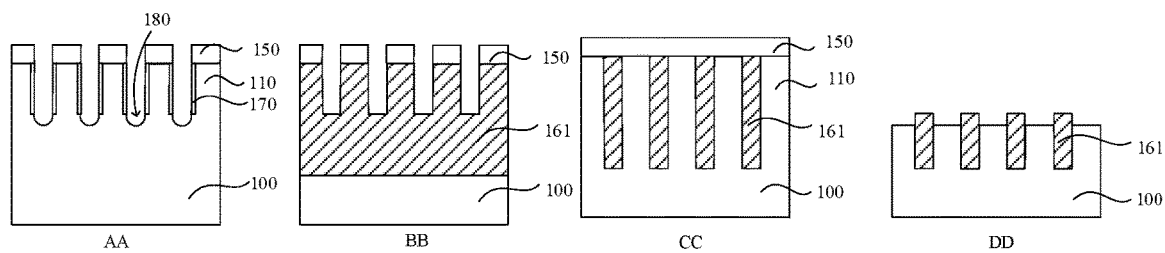

Referring to FIG. 7, bit line grooves 180 are formed, where the bit line grooves 180 are positioned in the substrate 100 and are connected to the spacer layers 170. In some embodiments, a part of the substrate 100 may be etched by means of wet etching to form the bit line grooves 180, and the formation of the bit line grooves 180 provides a process basis for the subsequent formation of the bit lines.

In some embodiments, the width of the bit line grooves 180 along the first direction X may be greater than the pitch between the adjacent semiconductor channels 110, such that there are less substrate materials needing to be subjected to metal siliconization in the subsequent process of forming the bit lines 120, thereby facilitating forming continuous metal silicide layers, and further increasing the transmission rate of the bit lines 120. In some other embodiments, the width of the bit line grooves 180 along the first direction X may be equal to the pitch between the adjacent semiconductor channels 110.

In some embodiments, the shape of the cross-sectional view of the bit line grooves 180 along the first direction X may be an ellipse or a semicircle. In some other embodiments, the shape of the cross-sectional view of the bit line grooves 180 along the first direction X may also be a rectangle.

The embodiments of the present disclosure do not limit the shape and width of the bit line grooves 180, which may be adjusted according to actual conditions.

Figure 8:
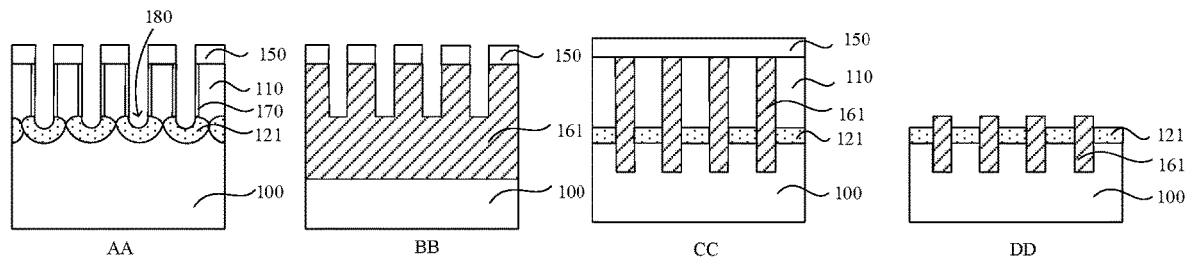
Figure 9:
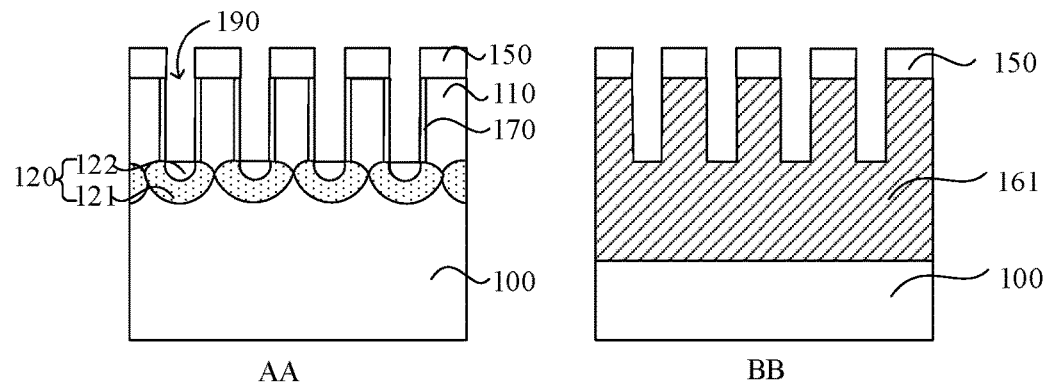

Referring to FIG. 8 to FIG. 10, the bit lines 120 are formed, and the first doped region is in contact with the bit lines 120.

In some embodiments, referring to FIG. 8, the metal silicide layers 121 are formed by means of a metal silicide process, and the metal silicide layers 121 extend from the bit line grooves 180 into the substrate 100. The resistance of the bit lines 120 may be reduced by forming the metal silicide layers 121.

In some embodiments, the metal silicide layers 121 are formed in the substrate 100 by forming a metal layer on the surface of the substrate 100 and performing rapid thermal annealing and selective wet etching. The material of the metal layer may be a metal such as titanium, cobalt, and molybdenum.

Referring to FIG. 9 and FIG. 10, the bit line metal layers 122 are formed, the bit line metal layers 122 are positioned on the surfaces of the bit line grooves 180, and the metal silicide layers 121 and the bit line metal layers 122 constitute the bit lines 120. The conduction rate of the bit lines 120 may be increased by forming the bit line metal layers 122, thereby increasing the response speed of the semiconductor structure.

In some embodiments, the bit line metal layers 122 may fill up the bit line grooves 180. In some other embodiments, the bit line metal layers 122 may be formed only on the surfaces of the bit line grooves 180. The embodiments of the present disclosure do not limit the bit line metal layers 122, which may be adjusted according to actual needs.

In some embodiments, the initial grooves 190 are formed while forming the bit lines 120, the initial grooves 190 extend along the second direction Y and the initial grooves 190 are arranged at intervals between the semiconductor channels 110 along the first direction X, and the initial grooves 190 further expose the top surfaces of the bit lines 120.

In some embodiments, the bit line metal layers 122 fill up the bit line grooves 180, so the initial grooves 190 only include the gaps between the adjacent semiconductor channels 110. In some other embodiments, the bit line metal layers 122 do not fill up the bit line grooves 180, and the initial grooves 190 further include part of the bit line grooves 180.

Referring to FIG. 11 to FIG. 20, the word lines 130 are formed, and the channel region and the second doped region are positioned between the adjacent word lines 130.

Figure 12:
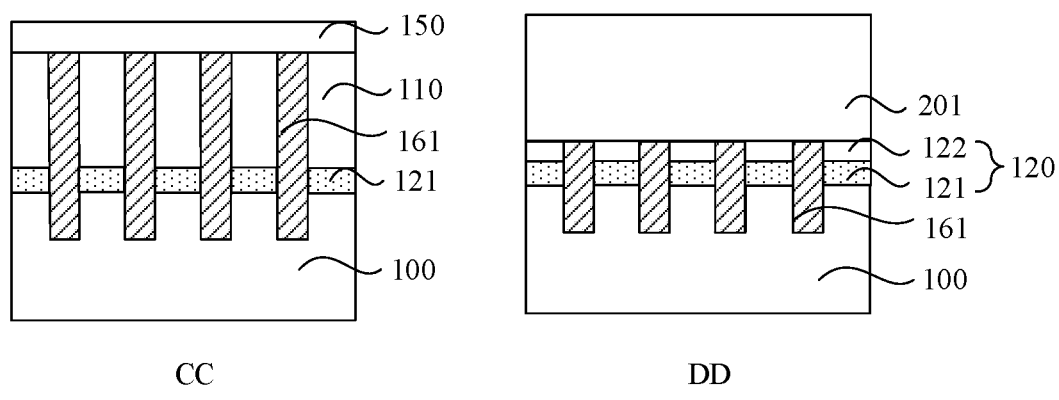

In some embodiments, referring to FIG. 11 and FIG. 12, initial isolation layers 201 are formed, and the initial isolation layers 201 fill up the initial grooves 190.

In some embodiments, a material of the initial isolation layers 201 may be a material such as silicon oxide, which has better insulating properties and is softer and easier to fill.

Figure 13:
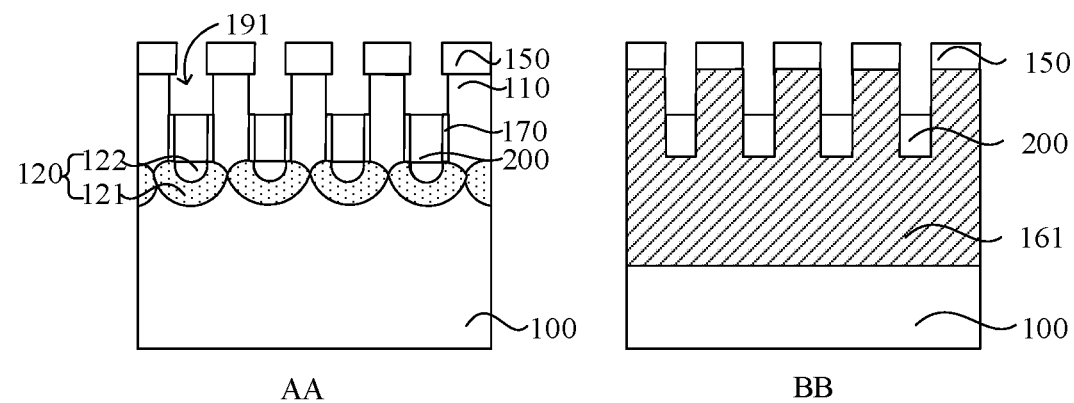
Figure 14:
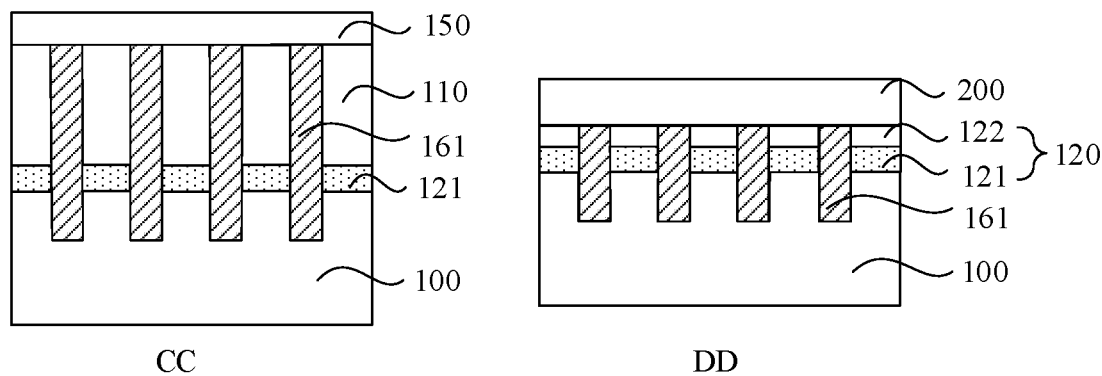

Referring to FIG. 13 and FIG. 14, the initial isolation layers 201 are patterned using the mask layer 150 as the mask (referring to FIG. 11), and remaining part of the initial isolation layers 201 are used as isolation layers 200.

The isolation layers 200 are positioned on the top surfaces of the bit lines 120, and heights of the isolation layers 200 in the direction perpendicular to the surface of the substrate 100 are smaller than depths of the initial grooves 190. The remaining part of the initial grooves 190 are used as grooves 191, and the grooves 191 extend along the second direction Y and the grooves 191 are arranged at intervals between the semiconductor channels 110 along the first direction X. By forming the isolation layers 200, electric connection between the bit lines 120 and the word lines formed subsequently may be avoided. By forming the grooves 191, the process basis may be provided for the subsequent formation of the word lines.

Part of the spacer layers 170 are also removed while patterning the initial isolation layers 201 to expose the side walls of part of the semiconductor channels 110, thereby providing the process basis for the subsequent formation of gate dielectric layers.

Figure 15:
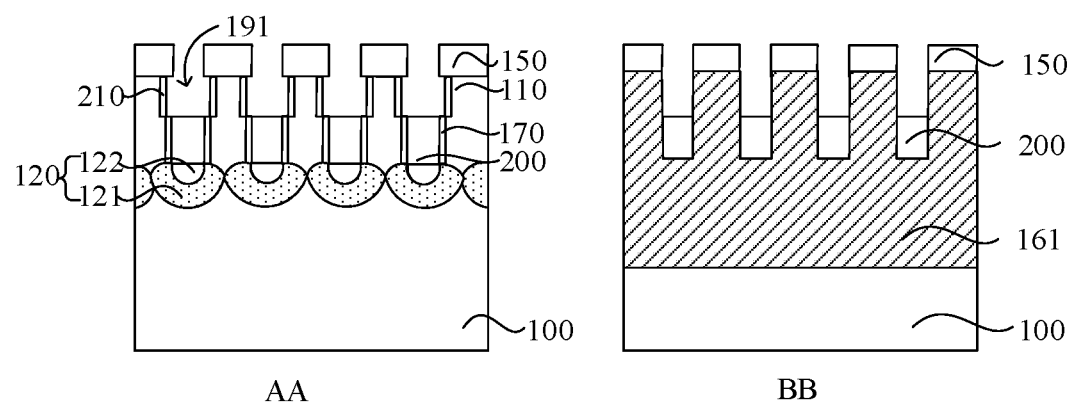

Referring to FIG. 15 and FIG. 16, gate dielectric layers 210 are formed. In some embodiments, the gate dielectric layers 210 may be formed by means of a thermal oxidation method, the gate dielectric layers 210 formed by means of the thermal oxidation method has a higher density, and the gate dielectric layers 210 formed have better properties. In some other embodiments, the spacer layers are not removed when the initial isolation structures are patterned, so the spacer layers may also be used as the gate dielectric layers.

In some embodiments, the gate dielectric layers 210 may be used as part of the dielectric layers 140 (referring to FIG. 1).

It is to be noted that, after the spacer layers 170 undergo the steps in the embodiments of the present disclosure, lattice defects of the spacer layers 170 may become more severe, and properties of the spacer layers 170 as the gate dielectric layers are not good. Therefore, the gate dielectric layers 210 may be formed by oxidizing the semiconductor channels 110 after removing part of the spacer layers 170, and the gate dielectric layers 210 formed have better properties.

In the embodiments of the present disclosure, when the spacer layers 170 are formed, the semiconductor channels 110 are oxidized once, and part of the spacer layers 170 are removed. The gate dielectric layers 210 are formed by oxidizing the semiconductor channels 110 again, so a larger space may be provided when the word lines are formed subsequently, thereby increasing the pitch between the adjacent word lines, reducing the parasitic capacitance between the adjacent word lines, and improving the properties of the semiconductor structure.

Figure 17:
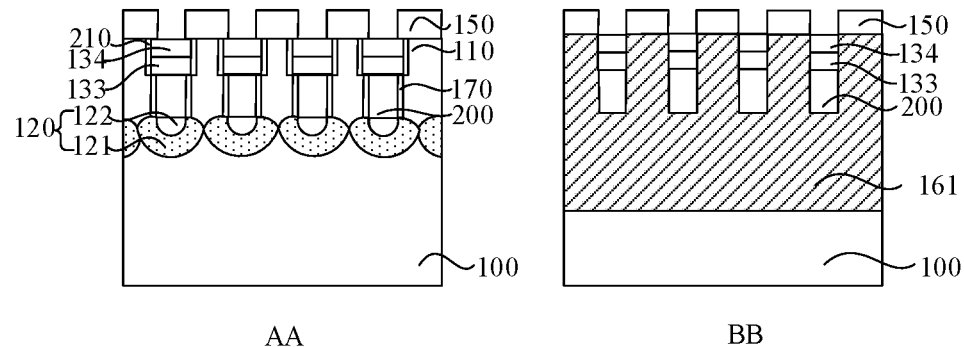
Figure 18:
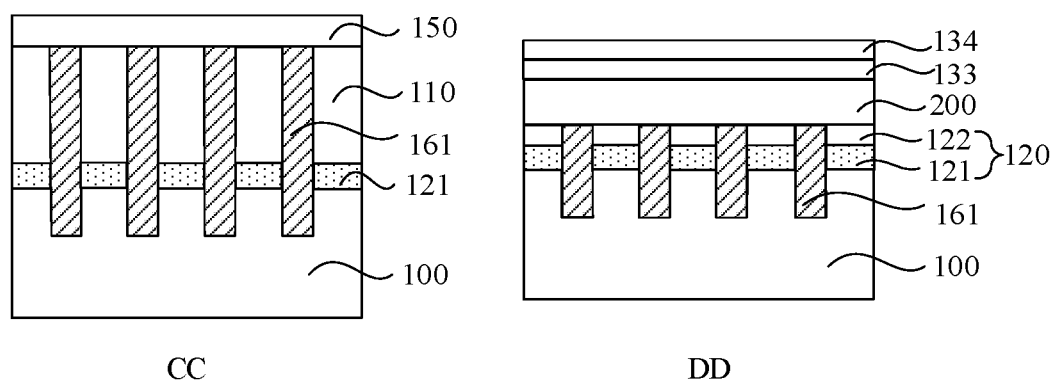

Referring to FIG. 17 and FIG. 18, in some embodiments, the forming the word lines 130 includes: forming word line conductive layers 133, where the word line conductive layers 133 extend along the second direction Y and the word line conductive layers 133 are arranged at intervals between the semiconductor channels 110 along the first direction X, and the word line conductive layers 133 cover part of the opposite side surfaces of the semiconductor channels 110 along the first direction X; and forming word line protective layers 134 positioned on top surfaces of the word line conductive layers 133, where the word line conductive layers 133 and the word line protective layers 134 constitute the word lines 130. The word line conductive layers 133 may be formed to transmit electrical signals, and the word line protective layers 134 may be formed to protect the word line conductive layers 133 in subsequent steps, thereby reducing the stress on the word line conductive layers 133.

In some embodiments, a material of the word line conductive layers 133 may be tungsten, and a material of the word line protective layers 134 may be silicon oxide or silicon nitride. In some other embodiments, the word line conductive layer 133 may also be a multi-layer stack structure, for example, including a polysilicon layer and a word line metal layer.

In some embodiments, the forming the word line conductive layers 133 includes: forming initial word line conductive layers (not shown in the figure), where the initial word line conductive layers fill part of the grooves 191; and etching back the initial word line conductive layers to form the word line conductive layers 133. It is convenient to control heights of the formed word line conductive layers 133 by forming the initial word line conductive layer first and then etching back the initial word line conductive layers, such that required heights of the word line conductive layer 133 may be adjusted according to actual situations.

Figure 19:
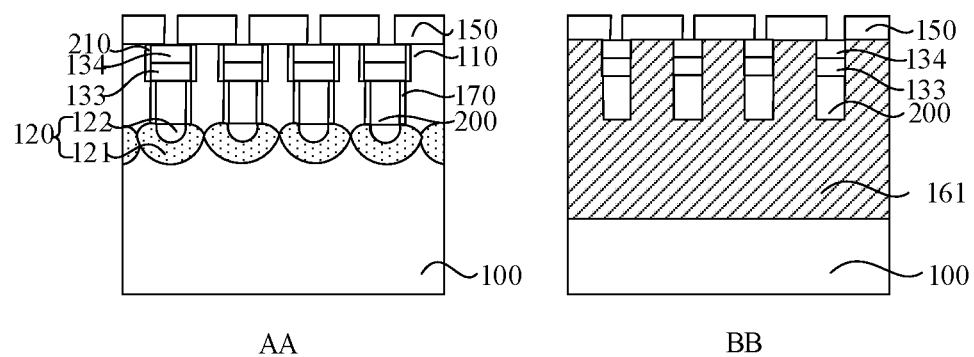
Figure 20:
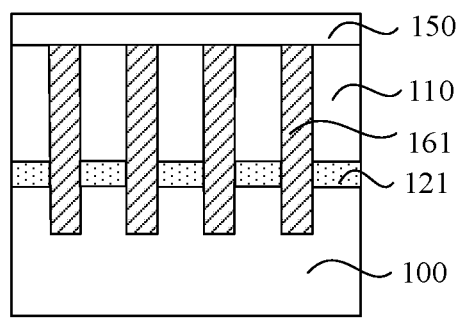
Figure 20:
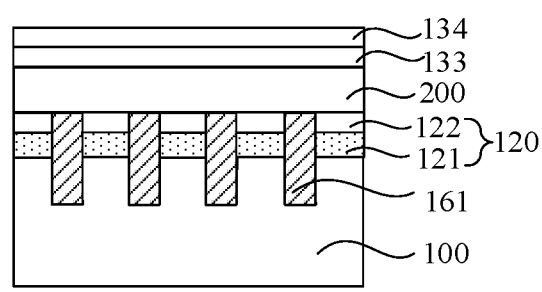

Referring to FIG. 19 and FIG. 20, the mask layer 150 is thickened, such that a width of the mask layer 150 along the second direction Y is increased. The width of the mask layer 150 may be increased by means of deposition, thereby providing the process basis for the subsequent formation of the adjacent word lines. The pitch between the adjacent word lines formed may be controlled by controlling the width of the mask layer 150.

Figure 21:
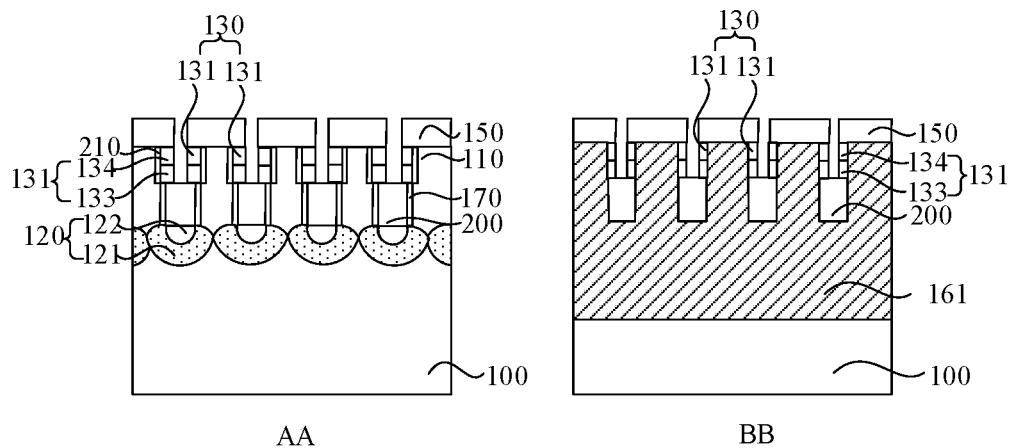
Figure 22:
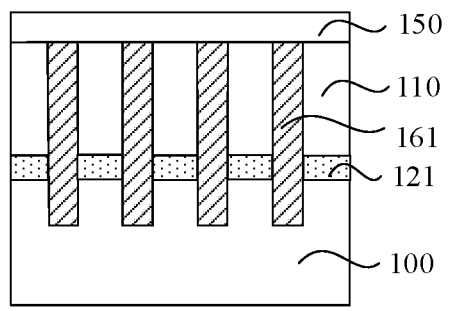
Figure 22:
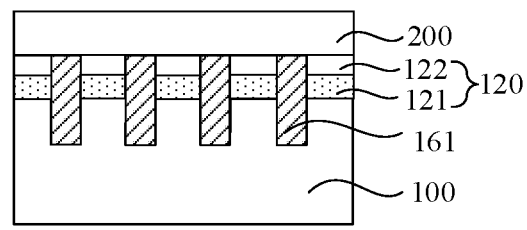

Referring to FIG. 21 and FIG. 22, the word line conductive layers 133 and the word line protective layers 134 are patterned using the mask layer 150 as the mask to form the sub word lines 131 arranged at intervals along the first direction X, and the sub word lines 131 positioned on two sides of the same semiconductor channel 110 are used as one word line 130. Patterning the word line conductive layers 133 and the word line protective layers 134 using the same mask layer 150 may reduce number of times of forming the mask and reduce duration of the semiconductor process.

Referring to FIGS. 23 to 26, isolation structures 160 are formed, and the isolation structures 160 are positioned between the adjacent word lines 130.

Figure 23:
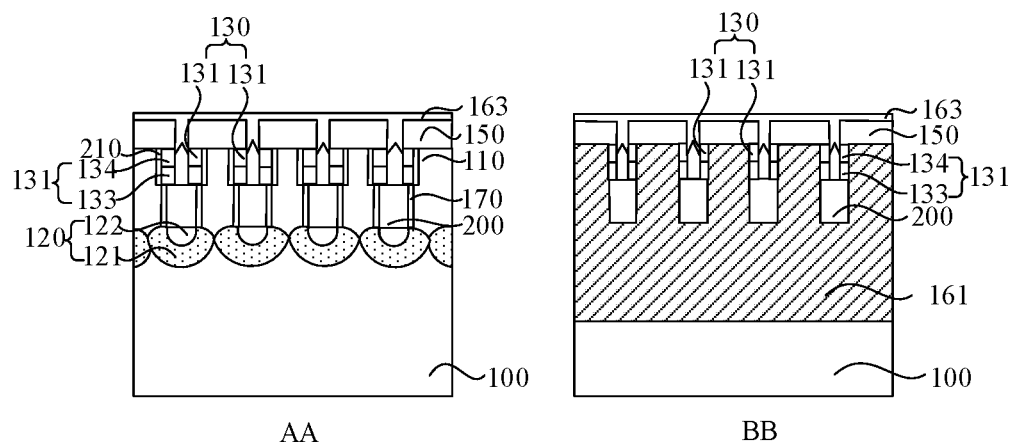
Figure 24:
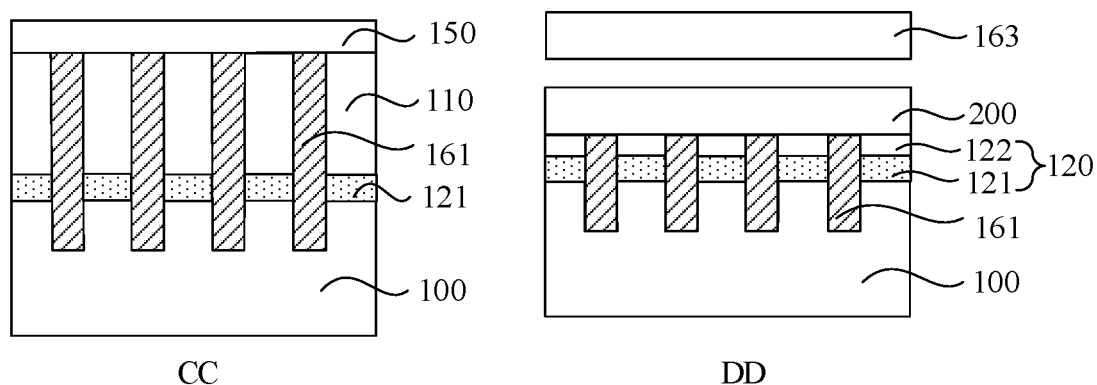

In some embodiments, referring to FIG. 23 and FIG. 24, second initial isolation structures 163 are formed. The second initial isolation structures 163 may be made of a material with a poor filling capability, such that the gaps between the semiconductor channels 110 may not be filled up when the second initial isolation structures 163 are formed, the air gaps may be formed between the adjacent word lines 130, and the parasitic capacitance between the adjacent word lines 130 may be reduced, thereby improving the properties of the semiconductor structure.

The second initial isolation structure 163, the word line 130 and the isolation layer 200 also enclose an air gap, and the air gap serves as the first isolation structure 164.

Figure 25:
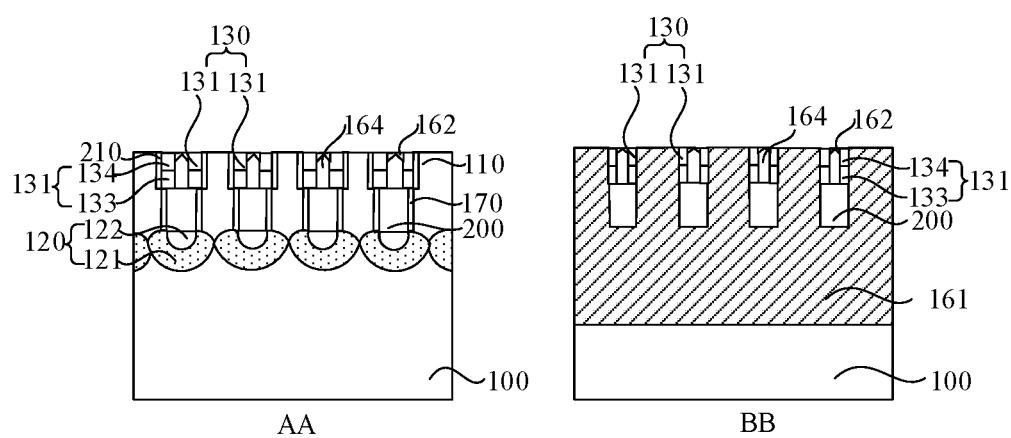
Figure 26:
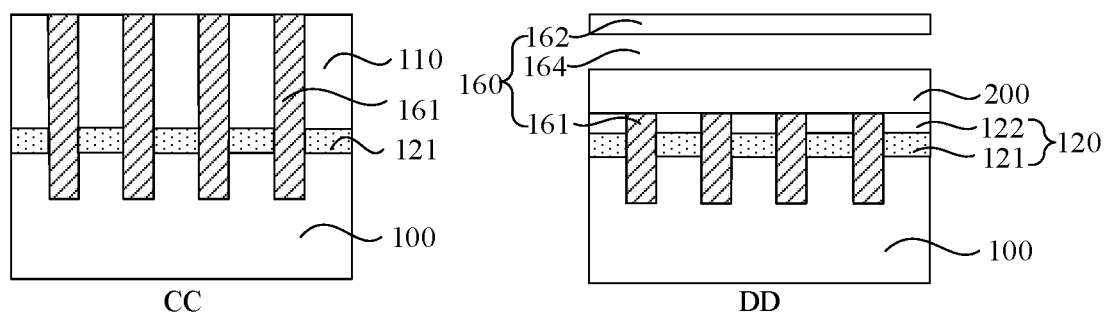

Referring to FIG. 25 and FIG. 26, a second isolation structure 162 is formed. In some embodiments, the second initial isolation structure 163 (referring to FIG. 23) may be patterned to expose the surfaces of the semiconductor channels 110, and remaining part of the second initial isolation structure 163 (referring to FIG. 23) is used as the second isolation structure 162.

The filling layer 161, the second isolation structure 162 and the first isolation structure 164 together constitute the isolation structure 160.

After forming the isolation structure 160, the method further includes: performing ion doping on the first doped region, the channel region and the second doped region. In some embodiments, the first doped region may be heavily doped first to correspondingly form the source or the drain, then the channel region is lightly doped to form the gate, and then the second doped region is heavily doped to correspondingly form the source or the drain.

In some embodiments, a top surface of the first doped region is flush with the bottom surface of the word line 130, or the top surface of the first doped region is lower than the bottom surface of the word line 130. The bottom surface of the channel region is lower than that of the word line conductive layer 133, the top surface of the channel region is higher than that of the word line conductive layer 133, or the bottom surface and the top surface of the channel region are flush with the bottom surface and the top surface of the word line conductive layer 133. The bottom surface of the second doped region is flush with the top surface of the word line conductive layer 133 or the bottom surface of the second doped region is higher than the top surface of the word line conductive layer 133.

According to the embodiments of the present disclosure, the sub word lines 131 arranged at intervals along the first direction X are formed by providing the method for fabricating the semiconductor structure, and the sub word lines 131 extend along the second direction Y. The functions of the word lines 130 may be achieved by forming the sub word lines 131 extending in the second direction, and the parasitic capacitance between the adjacent word lines 130 may be reduced by forming the isolation structures 160 including the air gaps between the word lines 131, thereby improving the electrical properties of the semiconductor structure.

Another embodiment of the present disclosure further provides a semiconductor structure. The semiconductor structure may be formed by means of some or all of the above steps. The semiconductor structure provided by another embodiment of the present disclosure will be described below with reference to the accompanying drawings. Reference may be made to the corresponding descriptions of the foregoing embodiments for the same or corresponding part of the foregoing embodiments, which will not be repeated below.

Referring to FIG. 1, FIG. 25 and FIG. 26, an embodiment of the present disclosure provides a semiconductor structure, which includes: a substrate 100, a plurality of semiconductor channels 110, bit lines 120, word lines 130, and isolation structures 160. The plurality of semiconductor channels 110 are positioned on the substrate 100, and the plurality of semiconductor channels 110 are arranged in an array along a first direction X and a second direction Y. The bit lines 120 extend along the first direction X, the bit lines 120 are positioned in the substrate 100, and each of the bit lines 120 is electrically connected to the plurality of semiconductor channels 110 arranged along the first direction X. The word lines 130 extend along the second direction Y, the word lines 130 wrap part of side surfaces of the plurality of semiconductor channels 110 arranged along the second direction Y, one of the word lines 130 includes two sub word lines 131 arranged at intervals along the first direction X, and the sub word lines 131 cover part of opposite side surfaces of the semiconductor channels 110 along the first direction X. The isolation structures 160 are positioned between adjacent word lines 130 and between adjacent sub word lines 131 respectively.

One word line 130 is constituted by two sub word lines 131 arranged at intervals along the first direction, and the sub word lines 131 extend along the second direction. The adjacent word lines 130 and the adjacent sub word lines 131 are isolated by means of the isolation structures 160, such that the parasitic capacitance between the adjacent word lines 130 may be reduced by means of the isolation structures 160, thereby improving the electrical properties of the semiconductor structure.

In some embodiments, the word lines 130 include: word line conductive layers 133 and word line protective layers 134. The word line conductive layers 133 extend along the second direction Y and the word line conductive layers 133 are arranged at intervals between the semiconductor channels 110 along the first direction X, and the word line conductive layers 133 cover part of the opposite side surfaces of the semiconductor channels 110 along the first direction X. The word line protective layers 134 are positioned on top surfaces of the word line conductive layers 133, and the word line conductive layers 133 and the word line protective layers 134 constitute the word lines 130. The word line conductive layers 133 are configured for signal transmission between the word lines 130, and the word line protective layer 134 is configured to reduce the stress on the word line conductive layer 133 when the semiconductor structure is under stress, to protect the word line conductive layers 133. In some other embodiments, the word lines may also only include the word line conductive layers.

In some embodiments, the bit lines 120 include: metal silicide layers 121 positioned in the substrate 100, where the metal silicide layers 121 are electrically connected to the semiconductor channels 110; and bit line metal layers 122, where the bit line metal layers 122 are positioned on surfaces of the metal silicide layers 121. The metal silicide layers 121 may be configured to reduce a contact resistance between the bit lines 120, thereby improving the electrical properties of the semiconductor structure, and the bit line metal layers 122 may be configured to improve a transmission rate of the bit lines 120, thereby reducing response time of the semiconductor structure.

In some embodiments, the top surfaces of the bit line metal layers 122 are flush with the bottom surfaces of the semiconductor channels 110 in the direction perpendicular to the substrate 100. It is to be noted that, the flush herein may refer to that the top surfaces of the bit line metal layers 122 are completely flush with the bottom surfaces of the semiconductor channels 110, or may refer to that the height difference between the top surfaces of the bit line metal layers 122 and the bottom surfaces of the semiconductor channels 110 is within an allowable error range. By setting the top surfaces of the bit line metal layers 122 to be flush with the bottom surfaces of the semiconductor channels 110, the contact area between the bit lines 120 and the substrate 100 may be increased, thereby reducing the contact resistance between the bit lines 120 and the substrate 100, and improving the electrical properties of the semiconductor structure.

In some embodiments, the isolation structures include: a first isolation structure 164 positioned between the adjacent word lines 130; and a second isolation structure 162 positioned on a top surface of the first isolation structure 164. By arranging the first isolation structure 164 and the second isolation structure 162, insulation properties between the adjacent word lines 130 can be increased, and thus reliability of the semiconductor structure can be improved.

In some embodiments, the semiconductor structure further includes isolation layers 200, where the isolation layers 200 are positioned on top surfaces of the bit lines 120 and are positioned on bottom surfaces of the word lines 130. The first isolation structure 164 is an air gap enclosed by the adjacent word lines 130, the second isolation structure 162, and the isolation layers 200. The isolation layers 200 are configured to isolate the word lines 130 from the bit lines 120 to avoid direct contact between the word lines 130 and the bit lines 120. The first isolation structure 164 is an air gap, and a dielectric constant of air is higher. By arranging the first isolation structure 164, the insulation properties between the adjacent word lines 130 can be improved, and the parasitic capacitances between the adjacent word lines 130 can be reduced.

In some embodiments, each of the semiconductor channels 110 includes a first doped region, a channel region and a second doped region arranged in sequence. The first doped region is in contact with the bit lines 120, the channel region and the second doped region are positioned between the adjacent word lines 130, and the first doping region, the channel region and the second doping region have the same doping ions.

Junctionless transistors may be formed by doping the semiconductor channels 110 with the same ion type. The junctionless transistors are that the doping ions in the first doped region, the channel region and the second doped region are of the same type, for example, the doping ions are all N-type ions, and furthermore, the doping ions in the first doped region, the channel region and the second doped region may be the same. "Junctionless" herein refers to no PN junction. That is, there is no PN junction in the transistor constituted by the semiconductor channels 110. Since the device is a junctionless transistor, it is beneficial to avoid the phenomenon of fabricating ultra-steep PN junctions within a nanometer scale by means of an ultra-steep source-drain concentration gradient doping process, the problems such as threshold voltage drift and leakage current increase caused by doping mutations may be avoided, it is also beneficial to suppress the short-channel effect, the device may still operate within the scale of several nanometers, and it is helpful to further improve the integration density and electrical properties of the semiconductor structure. It is to be understood that the additional doping herein refers to the doping performed to ensure the types of the doping ions in the first doped region I and the second doped region III are different from the type of the doping ions in the channel region II.

The embodiments of the present disclosure provide a semiconductor structure, including the sub word lines 131 arranged at intervals along the first direction X; and the sub word lines 131 extend along the second direction Y. The sub word lines 131 extending in the second direction may achieve the functions of the word lines 130, and the isolation structures 160 between the word lines 130 may reduce the parasitic capacitance between the adjacent word lines 130, thereby improving the electrical properties of the semiconductor structure.

Those of ordinary skill in the art can understand that the above-mentioned embodiments are some embodiments for realizing the present disclosure, but in practical applications, various changes may be made to them in form and details without departing from the spirit and scope of the embodiments of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. A semiconductor structure, comprising:
   a substrate;
   a plurality of semiconductor channels positioned on the substrate, and the plurality of semiconductor channels being arranged in an array along a first direction and a second direction;
   bit lines extending along the first direction, the bit lines being positioned in the substrate, and each of the bit lines being electrically connected to the plurality of semiconductor channels arranged along the first direction;
   word lines extending along the second direction, the word lines wrapping part of side surfaces of the plurality of semiconductor channels arranged along the second direction, one of the word lines comprising two sub word lines arranged at intervals along the first direction, and the sub word lines covering part of opposite side surfaces of the plurality of semiconductor channels along the first direction; and
   isolation structures, the isolation structures being positioned between adjacent two of the word lines and between adjacent two of the sub word lines respectively.

2. The semiconductor structure according to claim 1, wherein the word lines comprise:
   word line conductive layers, the word line conductive layers extending along the second direction and the word line conductive layers being arranged at intervals between the plurality of semiconductor channels along the first direction, and the word line conductive layers covering part of the opposite side surfaces of the plurality of semiconductor channels along the first direction; and
   word line protective layers, the word line protective layers being positioned on top surfaces of the word line conductive layers, and the word line conductive layers and the word line protective layers constituting the word lines.

3. The semiconductor structure according to claim 2, wherein the isolation structures comprise: a first isolation structure positioned between adjacent two of the word lines; and
   a second isolation structure positioned on a top surface of the first isolation structure.

4. The semiconductor structure according to claim 3, further comprising isolation layers, the isolation layers being positioned on top surfaces of the bit lines and positioned on bottom surfaces of the word lines, and the first isolation structure being an air gap enclosed by the adjacent word lines, the second isolation structure, and the isolation layers.

5. The semiconductor structure according to claim 1, wherein the bit lines comprise metal silicide layers positioned in the substrate, the metal silicide layers being electrically connected to the plurality of semiconductor channels; and
   bit line metal layers, the bit line metal layers being positioned on surfaces of the metal silicide layers.

6. The semiconductor structure according to claim 5, wherein in a direction perpendicular to the substrate, top surfaces of the bit line metal layers are flush with bottom surfaces of the plurality of semiconductor channels.

7. The semiconductor structure according to claim 1, wherein each of the plurality of semiconductor channels comprises a first doped region, a channel region and a second doped region arranged in sequence, the first doped region being in contact with the bit lines, the channel region and the second doped region being positioned between adjacent two of the word lines, and the first doped region, the channel region and the second doped region having same doping ions.

* * * * *